(12) United States Patent
Nakashima et al.

(10) Patent No.: US 9,698,037 B2
(45) Date of Patent: Jul. 4, 2017

(54) SUBSTRATE PROCESSING APPARATUS

(75) Inventors: Seiyo Nakashima, Toyama (JP); Yuichi Matsuda, Toyama (JP); Takashi Nogami, Toyama (JP); Shinobu Sugiura, Toyama (JP); Tomoyuki Yamada, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 510 days.

(21) Appl. No.: 13/156,925

(22) Filed: Jun. 9, 2011

(65) Prior Publication Data

US 2011/0305543 A1 Dec. 15, 2011

(30) Foreign Application Priority Data

Jun. 14, 2010 (JP) ................................ 2010-135200
Oct. 1, 2010 (JP) ................................ 2010-223704
Mar. 8, 2011 (JP) ................................ 2011-050418

(51) Int. Cl.
*H01L 21/677* (2006.01)
*H01L 21/67* (2006.01)

(52) U.S. Cl.
CPC .. *H01L 21/67757* (2013.01); *H01L 21/67017* (2013.01)

(58) Field of Classification Search
CPC ................................................. H01L 21/67196
USPC ......... 454/187, 322, 24, 184, 234, 288, 324, 454/49–67; 414/805, 217.1, 437, 939
See application file for complete search history.

(56) References Cited

U.S. PATENT DOCUMENTS

| | | | | |
|---|---|---|---|---|
| 2,022,077 A | * | 11/1935 | Dinspel | ........................... 406/17 |
| 3,895,570 A | * | 7/1975 | Eagleson, Jr. | .......... B08B 15/02 |
| | | | | 454/57 |
| 4,262,878 A | * | 4/1981 | O'ffill | ........................ 251/175 |
| 5,551,984 A | | 9/1996 | Tanahashi | |
| 5,944,602 A | * | 8/1999 | Grundy | ........................ 454/187 |
| 6,364,762 B1 | * | 4/2002 | Kaveh et al. | ................. 454/187 |
| 7,204,751 B2 | * | 4/2007 | Jang et al. | .................... 454/187 |
| 8,443,484 B2 | * | 5/2013 | Ozaki et al. | .................... 15/303 |
| 2008/0105204 A1 | * | 5/2008 | Nakada et al. | ............... 118/728 |
| 2009/0203306 A1 | * | 8/2009 | Sugata | ..................... B60S 5/00 |
| | | | | 454/234 |

FOREIGN PATENT DOCUMENTS

| | | |
|---|---|---|
| JP | 2007-095879 A | 4/2007 |
| JP | 2008-141176 A | 6/2008 |
| KR | 10-2008-0041112 A | 5/2008 |

* cited by examiner

*Primary Examiner* — Avinash Savani
*Assistant Examiner* — Vivek Shirsat
(74) *Attorney, Agent, or Firm* — Volpe and Koenig, P.C.

(57) ABSTRACT

A substrate processing apparatus includes a holder configured to hold a substrate and carry the substrate into a process chamber, a waiting station located outside the process chamber in which the holder waits prior to carrying the substrate into the process chamber, a circulation path configured to circulate a gas throughout the waiting station, and an exhaust path formed in the circulation path and configured to exhaust the gas from the waiting station.

17 Claims, 15 Drawing Sheets

SUBSTRATE PROCESSING APPARATUS

CROSS-REFERENCE TO RELATED APPLICATIONS

This application is based upon and claims the benefit of priority from Japanese Patent Applications Nos. 2010-135200, filed on Jun. 14, 2010; 2010-223704, filed on Oct. 1, 2010; and 2011-50418, filed on Mar. 8, 2011, the entire contents of which are incorporated herein by reference.

TECHNICAL FIELD

The present disclosure relates to a substrate processing apparatus, and more particularly relates to, for example, an apparatus for use in a method of manufacturing a semiconductor integrated circuit (hereinafter referred to as an "IC"), which may be effectively employed in heat treatment equipment (e.g., a furnace) which performs heat treatment on a semiconductor wafer (hereinafter referred to as "wafer") having an IC manufactured thereon.

BACKGROUND

In the process of manufacturing an IC, a heat treatment apparatus is extensively used for heat treatment processes of forming a CVD (Chemical Vapor Deposition) film such as an insulating film, a metal film, a semiconductor film or the like on a wafer, or diffusing impurity into a wafer. Such a heat treatment apparatus includes a process chamber to process a plurality of wafers loaded in a boat (or a holder) in a batch mode, a waiting station in which the boat is waiting before or after being loaded or unloaded to/from the process chamber, a boat elevator provided in the waiting station to elevate the boat between the waiting station and the process chamber, a wafer transfer equipment provided in the waiting station to transfer the wafers to the boat, and a clean unit to supply clean air into the waiting station. In the heat treatment apparatus with this arrangement, the clean unit supplies nitrogen gas (used as inert gas) into the waiting station so that the nitrogen gas is circulated therein, which prevents a natural oxidation film from being formed on the wafer by oxygen ($O_2$) in the atmosphere (see Japanese Patent Laid-Open Publication No. 2008-141176, for example).

In the heat treatment apparatus which circulates the nitrogen gas inside the waiting station, the nitrogen gas may be circulated from one side (typically from the front side) of the waiting station, so that a flow of the nitrogen gas in the waiting station may not be performed in a uniform manner. This may adversely affect the heat treatment. To address this problem, there is provided a mode in which the clean air from the clean unit is introduced into one side of the waiting station and is exhausted through an exhaust outlet formed in the other side (e.g., rear side) of the waiting station (hereinafter referred to as a "atmosphere mode").

However, in the atmosphere mode-based heat treatment, the temperature of a portion of the clean air supplied from the clean unit is increased while it flows through the circulation path, which makes it difficult to evenly distribute the fresh clean air inside the waiting station.

In another approach, in order to suppress the generation of particles from the wafer and the wafer transfer equipment, or decrease the temperature in the periphery of the boat and the wafer transfer equipment, gas inlets formed in the circulation path are disposed in the vicinity of the boat and the wafer transfer equipment. However, even if such gas inlets of the circulation path are disposed in the vicinity of the boat and the wafer transfer equipment, it is difficult to suppress the generation of particles from the boat and the wafer transfer equipment while they are moving in a broad range. This may also result in a decrease of the wafer transfer speed.

SUMMARY

The present disclosure provides some embodiments of a substrate processing apparatus which makes air flow inside a waiting station uniform to thereby prevent contamination caused by particles or organic substances.

According to one embodiment of the present disclosure, a substrate processing apparatus includes a holder configured to hold a substrate and carry the substrate into a process chamber, a waiting station located outside the process chamber configured to contain the holder waiting prior to being carried into the process chamber, a circulation path configured to circulate gas throughout the waiting station, and an exhaust path formed in the circulation path and configured to exhaust the gas from the waiting station.

DETAILED DESCRIPTION

Figure 1:
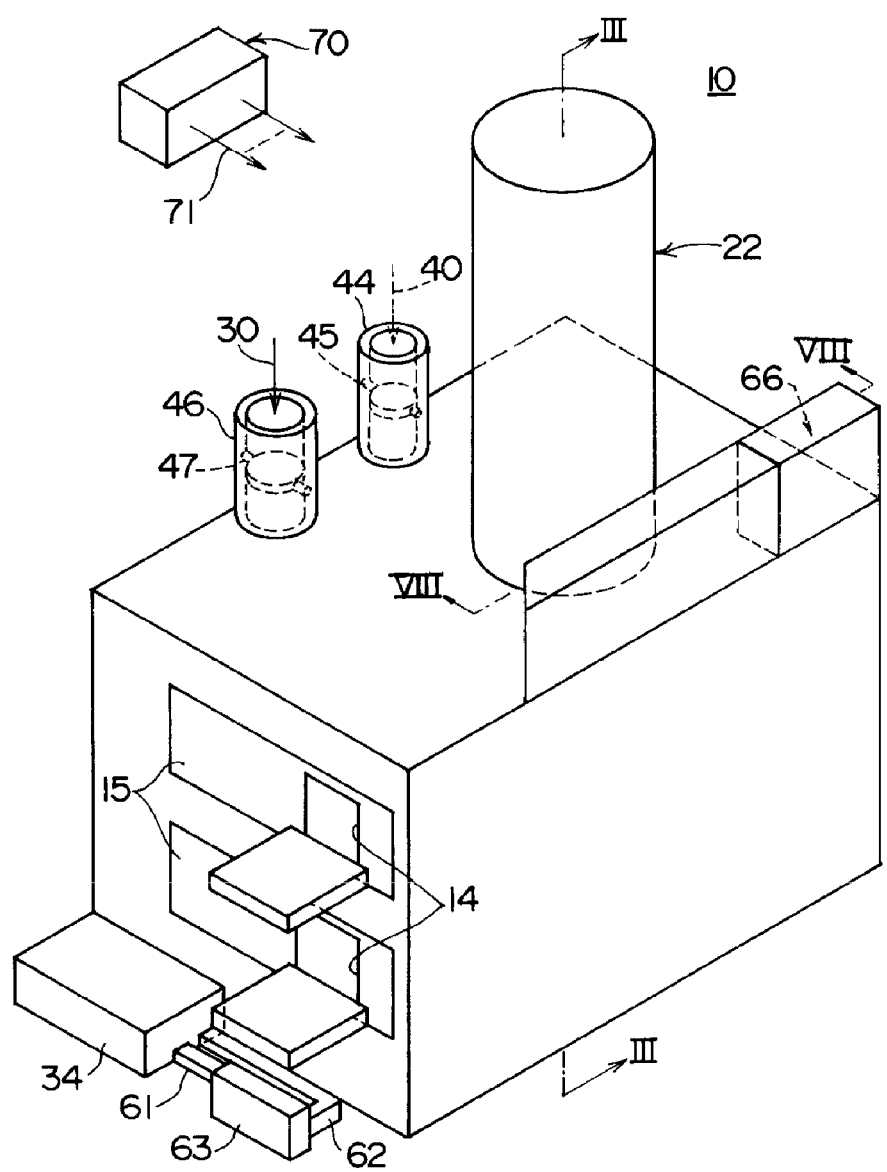
FIG. 1 is a perspective view of a heat treatment apparatus according to a first embodiment of the present disclosure.

Now, a first embodiment of the present disclosure will be described with reference to the drawings.

A substrate processing apparatus according to the first embodiment includes a configuration of a heat treatment apparatus 10, as shown in FIGS. 1 to 6.

In the first embodiment, a FOUP (front opening unified pod) carrier is used as a carrier (e.g., a conveying jig) configured to hold and convey a wafer (used as a substrate). The FOUP is formed in an approximately cubic shape with an opening formed at one side thereof and configured to be covered by a cap detachably mounted thereon. The FOUP (hereinafter referred to as "pod") used as a carrier for a wafer may convey the wafer in a sealed state so that a cleanliness level thereof can be maintained even in the presence of particles in ambient atmosphere.

The heat treatment apparatus 10 includes a housing 11. The housing 11 has an air-tight structure where frames or panels are combined to maintain an air-tightness level comparable to the atmospheric pressure. The housing 11 includes a waiting station 12 where a holder configured to hold a plurality of wafers therein waits until it is carried into a process chamber. A pair of ports 14 configured to load and unload (or carry in/out) a wafer 1 is mounted on the front wall of the housing 11, such that the pair of ports 14 are vertically disposed adjacent to each other. The pair of ports 14 is hereinafter referred to as "wafer loading ports 14." Pod openers 15, which are configured to attach/detach a cap (not shown) to/from the pod 2 to thereby close/open and the pod 2, are mounted at respective positions corresponding to the wafer loading ports 14.

A transfer elevator 18 configured to elevate a wafer transfer equipment 17 is disposed in the front side of the waiting station 12. The wafer transfer equipment 17 is elevated by the transfer elevator 18 so that the wafer 1 is conveyed between the wafer loading ports 14 and the boat 21 (used as the holder). Thus, the wafer 1 is transferred between the pod 2 and the boat 21.

A boat elevator 19 is vertically disposed in the rear side of the waiting station 12. The boat elevator 19 is configured to elevate a sealing cap 20 which vertically supports the boat 21 (used as the holder). The sealing cap 20 is formed in a disc shape. The boat 21 is vertically disposed with its center aligned to the center of the sealing cap 20. The boat 21 is configured to hold the plurality of wafers 1 (used as the substrates) so that they are horizontally stacked with their centers concentrically aligned.

A tubular-shaped heater unit 22 (concentrically aligned with the boat 21) is vertically disposed in an upper part of the read side of the housing 11 so that it is supported by the housing 11. Inside the heater unit 22, an outer tube 23 and an inner tube 24 are disposed concentrically with the heater unit 22. The outer tube 23 may be made of a thermally-resistant material such as quartz, silicon carbide or the like. The internal diameter of the outer tube 23 is set to be greater than the external diameter of the inner tube 24 and may be formed in a tubular shape that is closed at the upper end and opened at the lower end. The inner tube 24 may be formed of a thermally-resistant material such as quartz, silicon carbide or the like, and may be formed in a tubular shape that is opened at the upper and lower ends. A process chamber 25 is disposed in a hollow portion of the inner tube 24 so that it accommodates the boat 21 therein.

Beneath the outer tube 23, a manifold 26 is disposed concentrically with the outer tube 23. The manifold 26 may be made of, for example, stainless steel or the like, and may be formed in a tubular shape that is open at upper and lower ends. The manifold 26 is engaged with the lower ends of the inner tube 24 and the outer tube 23 to support them. An opening (or a furnace opening) at the bottom end of the manifold 26 is configured to be opened/closed by means of a shutter 27.

An exhaust pipe 28 configured to evacuate the atmosphere inside the process chamber 25 is disposed on a side wall of the manifold 26 so that the exhaust pipe 28 passes through the gap formed between the outer tube 23 and the inner tube 24 to communicates with them. A gas supply tube 29 (used as a gas introducing part) is formed in the sealing cap 20 such that it is in communication with the process chamber 25.

A circulation path 31 configured to circulate gas inside the waiting station 12 is formed along the entire space of the housing 11. The circulation path 31 includes a suction duct 32 with suction inlets 33 formed thereon. The suction duct 32 is vertically extended and mounted over the entire surface of one side (hereinafter referred to as a "right side surface") of the waiting station 12, so that the transfer elevator 18 and the boat elevator 19 are separated from the waiting station 12. In the suction duct 32, the suction inlets 33 are formed in a range where an arm 19a of the boat elevator 19 and an arm 18a of the transfer elevator 18 are vertically movable. The arm 19a and the arm 18a are inserted into the suction inlets 33 so that they may vertically move within the suction inlets 33. The suction duct 32 functions to exhaust gas (e.g., nitrogen gas or clean air) existing within the waiting station 12 outside the waiting station 12. That is, the suction duct 32 constitutes an exhaust part configured to exhaust the gas within the waiting station 12.

The circulation path 31 includes a collection duct 34, which is horizontally disposed below the pod opener 15. First and second communication ducts 35 and 36 are disposed on the bottom surface of the waiting station 12. One end of the first communication duct 35 is connected to a side wall (facing the waiting station 12) of the collection duct 34, and the other end thereof is connected to the front side of the bottom end portion of the suction duct 32. One end of the second communication duct 36 is connected to the middle portion of the first communication duct 35, and the other end thereof is connected to a rear-side buffer duct (which will be described later).

The circulation path 31 includes an aspiration duct 39 with an aspiration outlet 38 formed over the entire surface thereof. The aspiration duct 39 is vertically disposed in the left side surface (facing the suction duct 32) of the waiting station 12. An aspiration end of the collection duct 34 is connected to the lower end portion of the aspiration duct 39. A cutoff valve 37 configured to cutoff gas flow between the collection duct 34 and the aspiration duct 39 is disposed in a portion at which the collection duct 34 is connected to the aspiration duct 39.

A clean unit 41 configured to supply nitrogen gas 30 and clean air 40 is vertically disposed on the aspiration outlet 38 of the aspiration duct 39. The clean unit 41 includes a filter 42 configured to collect particles, and a group of air blowers 43 configured to blow clean-filtered nitrogen gas 30 and clean air 40. The filter 42 is exposed toward the waiting station 12 and is disposed downstream from the group of air blowers 43 in an air flow direction.

Figure 3:
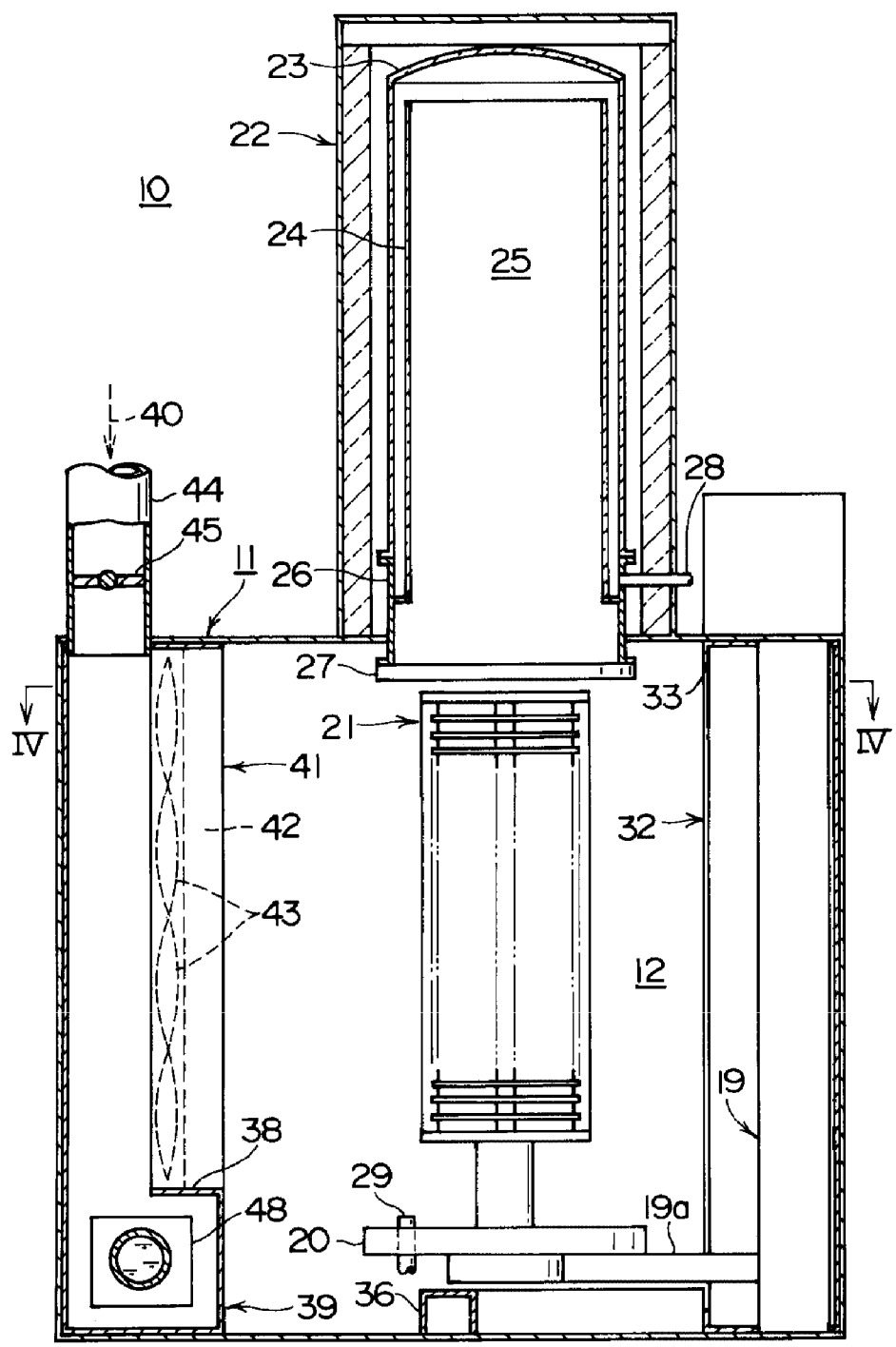
FIG. 3 is a front sectional view taken along line III-III in FIG. 1.

As shown in FIGS. 1 and 3, a fresh clean air supply tube 44 configured to supply fresh clean air 40 is disposed upstream from the clean unit 41 of the aspiration duct 39 in the air flow direction. The fresh clean air supply tube 44 is equipped with a damper 45 used as an on-off valve. Further, as shown in FIG. 1, a nitrogen gas supply tube 46 configured to supply nitrogen gas (used as inert gas) to the circulation path 31 is disposed on the aspiration duct 39. The nitrogen gas supply tube 46 is equipped with a damper 47 used as a flow rate controlling valve.

As shown in FIG. 3, a cooler 48 is disposed in the lower end portion of the aspiration duct 39 such that it is extended along a longitudinal direction thereof. The cooler 48 is configured to cool air that is collected by the aspiration duct 39 from the collection duct 34. In the present embodiment, the cooler 48 may be constructed using a water-cooled heat exchanger.

Figure 2:
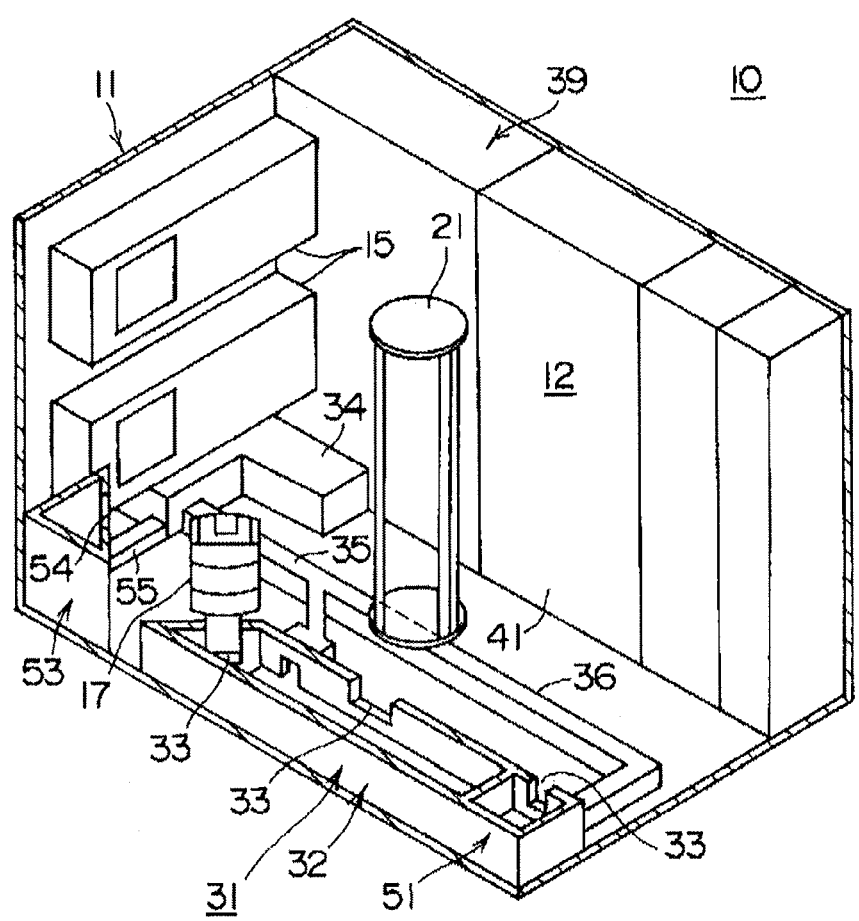
FIG. 2 is a partially broken perspective view of the heat treatment apparatus shown in FIG. 1.
Figure 4:
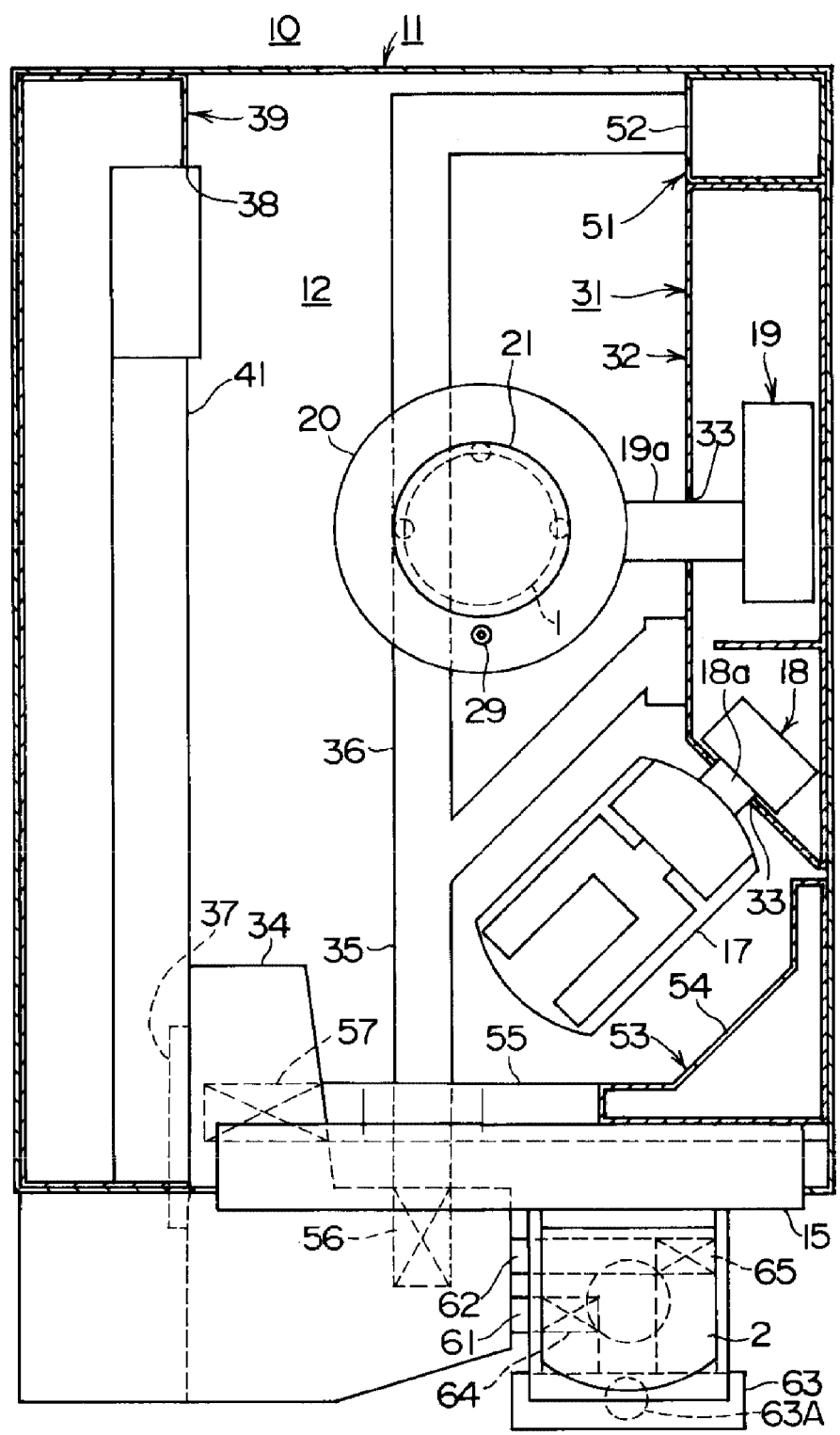
FIG. 4 is a plane sectional view taken along line IV-IV in FIG. 3.

As shown in FIGS. 2 and 4, a rear-side buffer duct 51 is vertically disposed adjacent to the suction duct 32 in the rear side of the suction duct 32. One end of the second communication duct 36 is connected to the lower end of the rear-side buffer duct 51. A suction inlet 52 is formed on the rear-side buffer duct 51 in a vertically elongated shape, and faces the clean unit 41 at the rear right corner of the waiting station 12. A front-side buffer duct 53 is vertically disposed in the front right corner of the waiting station 12. One wall of the front-side buffer duct 53 is at a 45 degree angle with respect to the front wall and the side wall of the buffer duct 53 such that the internal space of the front-side buffer duct 53 widens as it goes toward the front wall of the front-side buffer duct 53 (i.e., widens in a direction away from the waiting station 12). A suction inlet 54 is formed on the inclined side wall of the front-side buffer duct 53 in and has a vertically elongated shape. The suction inlet 54 faces the center portion of the clean unit 41.

One end of a third communication duct 55 is connected to the lower end portion of the front-side buffer duct 53 and the other end thereof is connected to the collection duct 34. The third communication duct 55 is disposed at the lower side of the waiting station 12 such that it transverses the first communication duct 35 in a widthwise direction without communicating with the first communication duct 35. As shown in FIG. 4, first and second circulation fans 56 and 57 are mounted at one end of the first communication duct 35 and one end of the third communication duct 55 at the side of the collection duct 34, respectively. These first and second circulation fans 56 and 57 are configured to establish air flow from the first and third communication ducts 35 and 55 to the collection duct 34.

Figure 5:
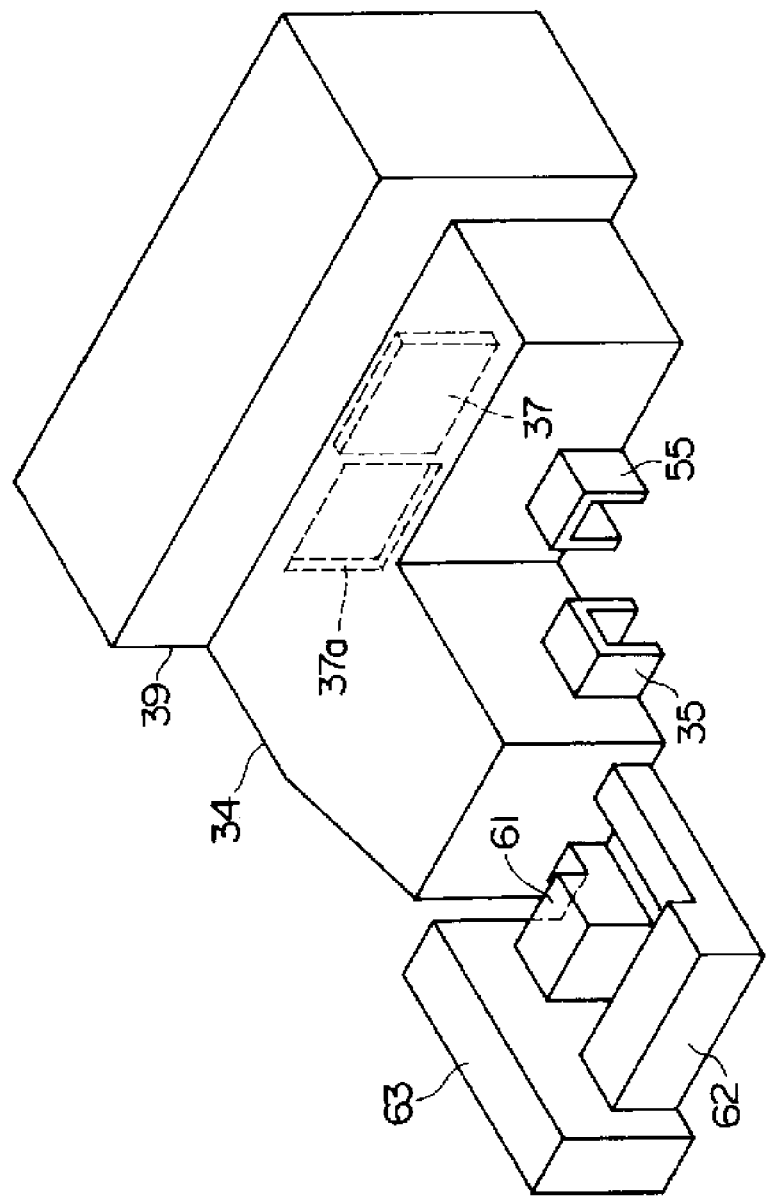
FIG. 5 is a partially broken perspective view showing a primary portion of the heat treatment apparatus.

As shown in FIGS. 1, 4 and 5, respective ends of first and second exhaust ducts 61 and 62, each of which is configured to form an exhaust path, are disposed adjacent to each other and connected to the collection duct 34. The first and second exhaust ducts 61 and 62 are disposed apart from the aspiration duct 39 with the first and third communication ducts 35 and 55 interposed therebetween. The other ends of first and second exhaust ducts 61 and 62 are connected to one end of a third exhaust duct 63. The third exhaust duct 63 is disposed in proximity to the front side of the housing 11. The other end (or an aspiration end) of the third exhaust duct 63 is connected to a lower grating space of a clean room (not shown). As shown in FIG. 4, first and second exhaust fans 64 and 65 are disposed in the first and second exhaust ducts 61 and 62, respectively. The first and second exhaust fans 64 and 65 are connected to the third exhaust duct 63 such that air flow from the collection duct 34 to the third exhaust duct 63 is established. An exhaust valve 63A is disposed in the third exhaust duct 63 to turn on/off the air flow.

Figure 8:
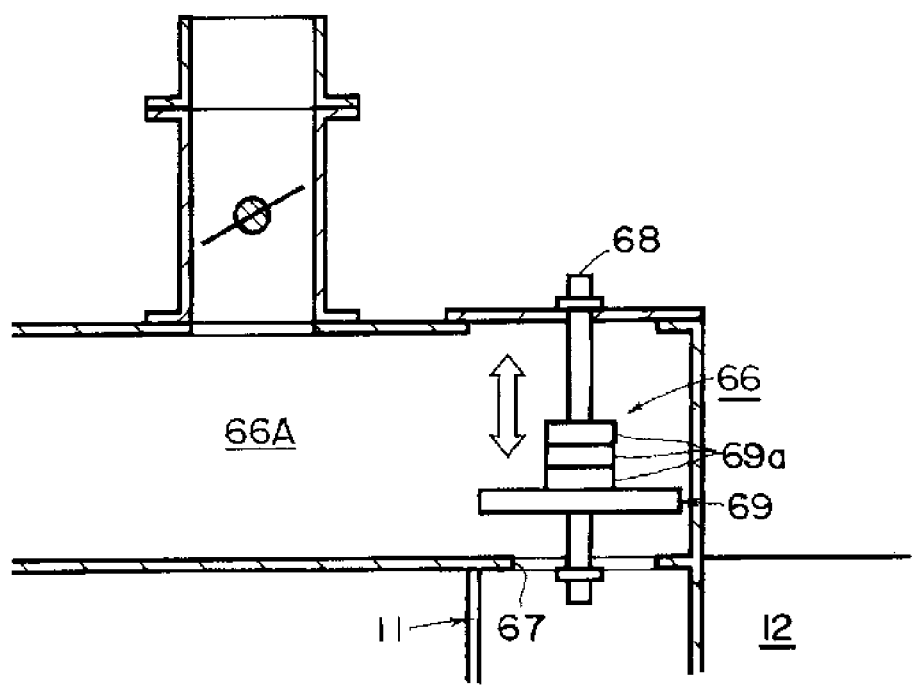
FIG. 8 is a sectional view taken along line VIII-VIII in FIG. 1.

As shown in FIG. 1, a pressure adjusting equipment 66 configured to automatically adjust pressure in the waiting station 12 is disposed on the housing 11. As shown in FIG. 8, the pressure adjusting equipment 66 includes a valve orifice 67 configured to connect the waiting station 12 to the clean room, and a valve element 69 configured to be slidably supported by a valve shaft 68 and configured to open/close the valve orifice 67. Weight of the valve element 69 may be adjusted by changing the number or weight of weights 69a. The pressure adjusting equipment 66 may adjust the pressure in the waiting station 12 according to a predetermined weight of the valve element 69 in an automatic control manner (or a self-alignment manner).

As shown in FIG. 1, the heat treatment apparatus 10 includes a controller 70. The controller 70 is configured to control the cutoff valve 37, the first and second circulation fans 56 and 57, and the first and second exhaust fans 64 and 65 via communication lines 71. Specifically, when the nitrogen gas 30 is supplied from the clean unit 41 into the waiting station 12, the controller 70 controls the cutoff valve 37 to open a valve orifice 37a (see FIG. 5) and operate the first and second circulation fans 56 and 57. Further, when the clean air 40 is supplied from the clean unit 41 into the waiting station 12, the controller 70 controls the cutoff valve 37 to close the valve orifice 37a and operate the first and second circulation fans 56 and 57 as well as the first and second exhaust fans 64 and 65.

The following is a description of the operation of the heat treatment apparatus with the above-mentioned configuration.

In a wafer carry-in operation, the pod 2 loaded on the board of the pod opener 15 is opened by detaching the cap covered on the pod 2 by means of the pod opener 15. Upon opening of the pod 2, a plurality of wafers 1 loaded in the pod 2 is transferred to the boat 21 by means of the wafer transfer equipment 17, thereby loading the wafers 1 into the boat 21 (in a charging operation). Upon loading of a preset number of the wafers 1, the boat 21 is elevated by means of the boat elevator 19 so that they are carried into the process chamber 25 (in a boat loading operation). When the boat 21 reaches the highest position within the process chamber 25, the sealing cap 20 (which supports the boat 21 thereon) is operated to abut against the lower surface of the manifold 26 in a sealed condition, thereby air-tightly closing the process chamber 25.

The process chamber 25 (air-tightly closed in the manner as describe above) is evacuated by means of the exhaust pipe 28 so that the pressure therein is maintained at a desired pressure (i.e., at a desired degree of vacuum). Further, the inside of the process chamber 25 is heated by the heater unit 22 so that the temperature therein is maintained at a desired temperature. Subsequently, a predetermined process gas is supplied from the gas supply tube 29 into the process chamber 25. Thus, the wafers 1 are subjected to a predetermined heat treatment (in a heat treatment operation).

Figure 6:
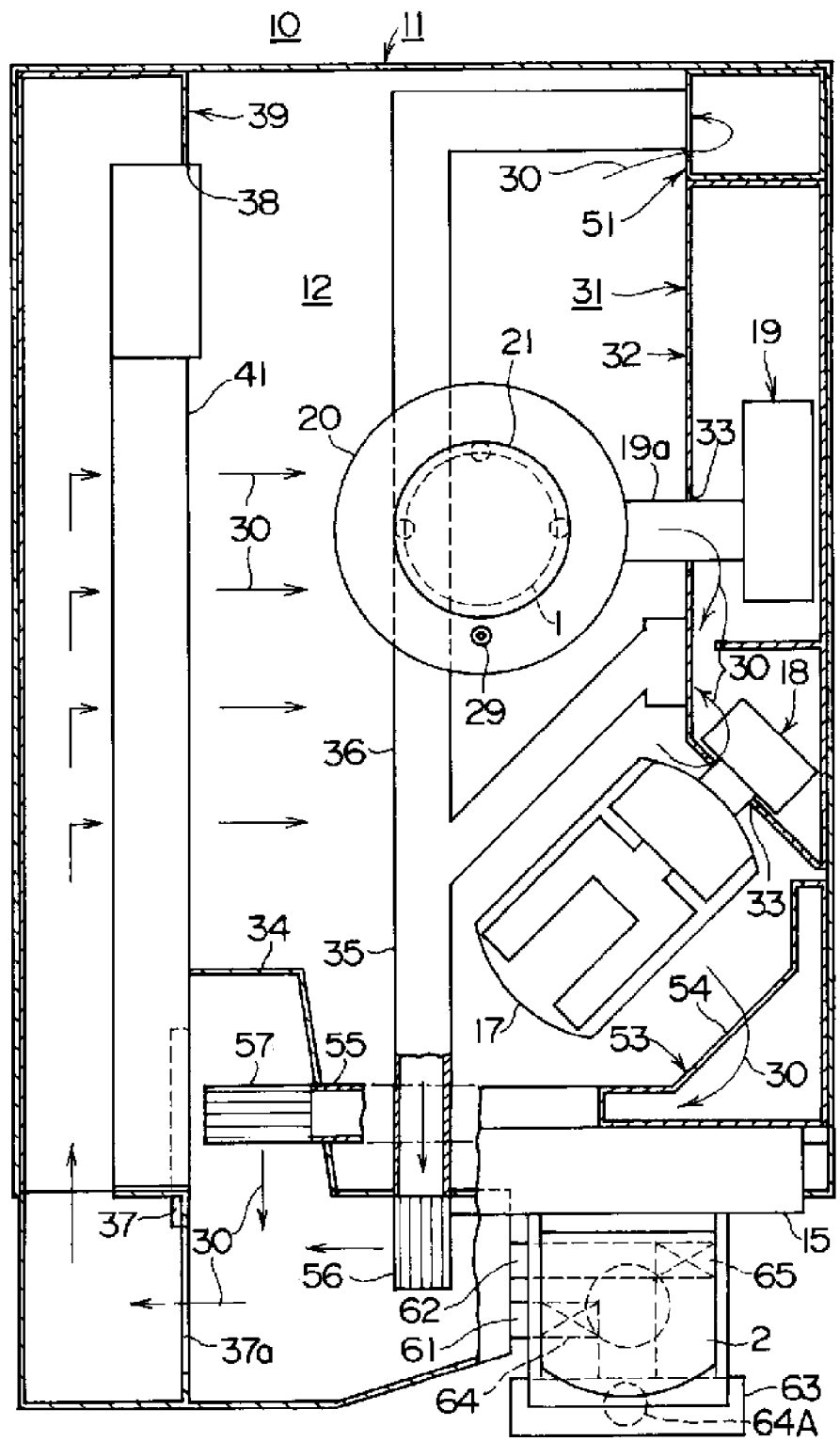
FIG. 6 is a plane sectional view showing the heat treatment apparatus being operated in a purge mode.

Prior to the wafer carry-in operation, the atmosphere inside the waiting station 12 and the circulation path 31 is displaced with atmosphere of the nitrogen gas 30. Then, in the course of the wafer carry-in operation and the heat treatment operation, the nitrogen gas 30 is circulated throughout the waiting station 12 through the circulation path 31. Specifically, as shown in FIG. 6, the nitrogen gas 30, which is supplied from the nitrogen gas supply tube 46 to the circulation path 31, is blown off from the clean unit 41 (which is vertically disposed on the aspiration duct 39 in the circulation path 31) toward the waiting station 12. Subsequently, the nitrogen gas 30 flows through the waiting station 12 (which serves as a part of the circulation path 31) to be sucked into the suction duct 32 through the suction inlets 33. At the same time, the nitrogen gas 30 is sucked into the rear-side buffer duct 51 and the front-side buffer duct 53 through the suction inlet 52 and the suction inlet 54, respectively. The nitrogen gas 30 sucked into the suction duct 32, the rear-side buffer duct 51 and the front-side buffer duct 53, flows through the first communication duct 35, the second communication duct 36, the third communication duct 55 and the collection duct 34, and flows again through the aspiration duct 39. Such re-circulated nitrogen gas 30 is blown off from the clean unit 41 toward the waiting station 12. At this time, since the exhaust valve 63A is in a closed state, the nitrogen gas 30 does not flow through the first to third exhaust ducts 61 to 63. The circulation flow of the nitrogen gas 30 as described above is repeated throughout the waiting station 12 and the circulation path 31. In this case, the pressure in the circulation path 31 (i.e., the waiting station 12) is automatically maintained at a constant pressure by means of the pressure adjusting equipment 66.

After a lapse of a predetermined period of process time, the boat 21 is moved downward by means of the boat elevator 19 so that the boat 21 with the processed wafers 1 loaded therein is transferred to the initial waiting position in the waiting station 12 (in a boat unloading operation). When the boat 21 is carried out of the process chamber 25, the process chamber 25 is closed by means of the shutter 27.

While flowing through the waiting station 12, the nitrogen gas 30 is in contact with the group of hot wafers 1 (which were subject to a heat treatment) and the boat 21 holding the wafers 1 therein, thereby performing a heat exchange therebetween and thus cooling the wafers 1 and the boat 21. In this manner, the nitrogen gas 30 (used as the inert gas) is in contact with the hot wafers 1, which prevents natural oxidation film(s) from being generated on the surfaces of the wafers 1.

The processed wafers 1 held by the boat 21 carried in the waiting station 12 are picked up by means of the wafer transfer equipment 17. At this time, an empty pod 2 is previously transferred to the wafer loading port 14. Then, a cap 3 of an empty pod 2 is detached from the empty pod 2 so that the picked-up wafers 1 are loaded in the empty pod 2. When the empty pod 2 is fully loaded with the processed wafers 1, the cap 3 is attached on the pod 2 to close the pod 2, and then the closed pod 2 is transferred from the wafer loading port 14 to another position.

Thereafter, the above-described operations are repeated so that subsequent wafers 1 are processed by means of the heat treatment apparatus 10 in a batch mode.

On the other hand, in case the formation of the natural oxidation film on the wafers are allowed, only one-way air flow (but not re-circulation thereof) may be performed inside the waiting station 12 using the clean air 40 in terms of, for example, controlling heat influence on the wafers. In this case (hereinafter referred to as an "atmosphere mode"), the clean air 40 generated by the clean unit 41 is horizontally blown toward the boat 21, thereby preventing particles or organic substances from becoming stagnant or retained in the waiting station 12. For preventing such particles or organic substances from becoming stagnant or retained in the waiting station 12, a high flow rate of the clean air 40 needs to be blown through the waiting station 12 to generate the one-way air flow.

Figure 7:
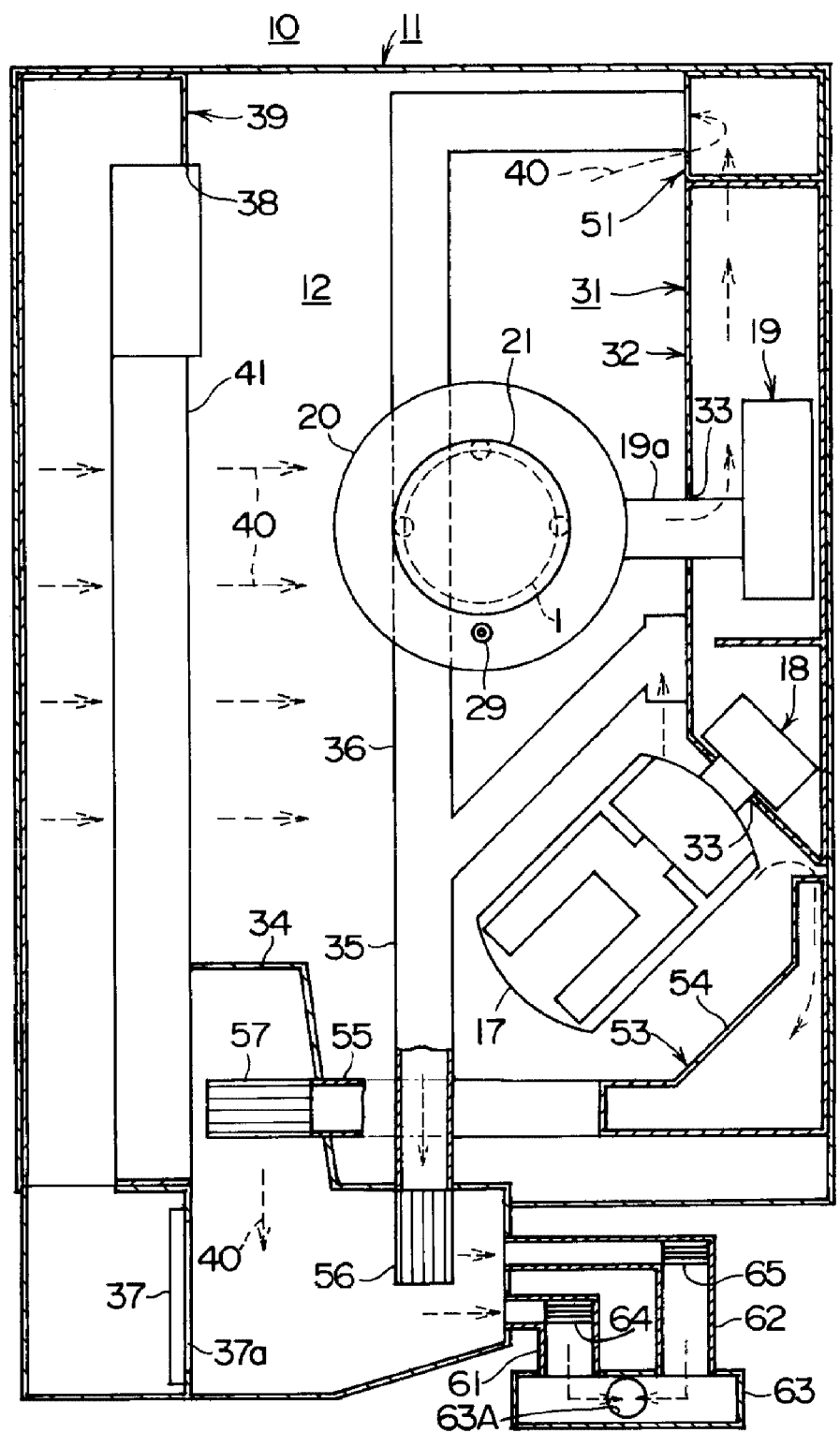
FIG. 7 is a plane sectional view showing the heat treatment apparatus being operated in an atmosphere mode.

Therefore, in the heat treatment apparatus 10 according to the first embodiment, in the atmosphere mode as shown in FIG. 7, the controller 70 controls the exhaust valve 63A to be opened and controls the cutoff valve 37 to be closed, and at the same time, controls the first and second circulation fans 56 and 57 and the first and second exhaust fans 64 and 65 to be operated. The fresh air, which is supplied from the fresh clean air supply tube 44 to the aspiration duct 39 by opening the damper 45 (see FIG. 1), is cleaned through the clean unit 41 and converted into a clean air 40. Then, the clean air 40 is horizontally blown off toward the waiting station 12, and continues to flow through the waiting station 12 to be sucked into the suction duct 32, the rear-side buffer duct 51 and the front-side buffer duct 53. As shown in FIG. 7, the clean air 40 sucked into these ducts 32, 51 and 52 is forcibly discharged through the first communication duct 35, the second communication duct 36, the third communication duct 55 and the collection duct 34 to the first exhaust duct 61, the second exhaust duct 62 and the third exhaust duct 63. Such exhaustion of the clean air 40 is driven by the first and second circulation fans 56 and 57 and the first and second exhaust fans 64 and 65. The clean air 40 discharged to the third exhaust duct 63 is discharged to the lower grating space of the clean room In the atmosphere mode, the one-way horizontal flow of the clean air 40 is sufficiently driven by the exhaustion force made by a series of the fans 56, 57, 64 and 65, which generates a high flow rate of the clean air 40 in the form of a laminar flow. Thus, the group of wafers 1 loaded in the boat 21 can be effectively cooled.

Further, similar to the suction inlets 33, the suction inlet 52 of the rear-side buffer duct 51 and the suction inlet 54 of the front-side buffer duct 53 are disposed both at upper and lower positions, so that the clean air 40 can be uniformly discharged both in the upper and lower horizontal directions. This allows the one-way horizontal flow of the clean air 40 to be uniformly formed both in upper and lower regions inside of the waiting station 12. Therefore, the group of wafers 1 loaded in the boat 21 can be uniformly cooled both in the upper and lower horizontal directions.

In contrast with the case of filling the waiting station 12 with the nitrogen gas 30, the one-way horizontal flow of the clean air 40 through the waiting station 12 may provide a quicker cooling of the group of heated wafers 1 loaded in the boat 21. In such case, the waiting station 12 may have an excessive positive pressure, which increases the temperature in the waiting station 12. This makes it difficult to cool the heated wafers 1 and also may cause oxidation of the wafers 1. However, in this embodiment, the clean air 40 is forcibly discharged by means of the plurality of fans 56, 57, 64 and 65 so that it prevents the pressure inside the waiting station 12 from increasing to have an excessive positive value, thereby preventing the above-described drawbacks.

Alternatively, the clean air may be exhausted out of the waiting station 12 directly from the collection duct 34 without employing the exhaust paths, to thereby realize the atmosphere mode. Unfortunately, such a method suffers from the following problems. To obtain sufficient exhaustion force, a large-sized exhaust valve is required to be mounted inside the collection duct 34. In addition, the pressure in the waiting station 12 needs to be adjusted using such a large-sized exhaust valve, which makes the exhaust valve structurally complicated. Such pressure adjustment may be performed by means of the first and second circulation fans 56 and 57. In this case, however, the flow rate (i.e., air flow rate) in the atmosphere mode may be equal to the flow rate in a circulation mode. For this reason, in this embodiment, the exhaust fans are mounted in the exhaust ducts constituting the exhaust path so that the pressure adjustment in the atmosphere mode may be performed by the exhaust fans. For example, an exhaustion force (e.g., a rotation frequency) of the first exhaust fan 64 may be constantly maintained while the exhaustion force of the second exhaust fan 65 is varied, which facilitates the adjustment of the pressure in the atmosphere mode.

The first embodiment as described above may have one or more of the following effects:

(1) The nitrogen gas is supplied from the clean unit to the waiting station. The nitrogen gas supplied into the waiting station is sucked by the suction duct, the rear-side buffer duct and the front-side buffer duct, which then flows again to the aspiration duct through the first to third communication ducts connected respectively to the suction duct, the rear-side buffer duct and the front-side buffer duct. In this manner, the nitrogen gas can be circulated through the waiting station 12 (in a purge mode), which certainly prevents the natural oxidation film from being formed on the wafer in the waiting station even if the wafer is prone to oxidation in the waiting station.

(2) The exhaust path is connected to the middle of the circulation path so that the clean air blown off into the waiting station from the clean unit is sucked into the suction duct, subsequently collected into the collection duct through the communication ducts, and then exhausted outside through the exhaust path. With this arrangement, a one-way horizontal flow of the clean air in the waiting station may be generated in the form of a laminar flow, which prevents the clean air from becoming stagnant or retained in the waiting station. This prevents the wafers in the waiting station from being contaminated with particles or organic substances.

(3) According to the features and effects as described in item (2) above, in a heat treatment process which may allow the formation of a certain amount of natural oxidation film on the wafer, it is possible to decrease or avoid use of the inert gas such as the nitrogen gas, thus leading to decrease in running cost.

(4) According to the features and effects as described in items (1) and (2) above, it is possible to perform both of circulating the nitrogen gas (i.e., in the purge mode) and generating a one-way flow of the clean air (i.e., in the atmosphere mode) in the same heat treatment apparatus. Also, both the flow (or air flow) in the atmosphere mode and the flow (or air flow) in the purge mode are generated in the same manner.

(5) The exhaust ducts constituting the exhaust path are disposed below the pod opener in the front side of the housing, thus avoiding increase in footprint of the heat treatment apparatus.

(6) The exhaust fans are mounted in the exhaust path so that they may be used in adjusting a pressure in the waiting station in the atmosphere mode. Further, the plurality of fans is disposed in the exhaust path and one of them is designed to generate a variable exhaust force (or a variable rotation frequency), which makes it possible to realize a pressure adjustment in the atmosphere mode with a simpler configuration.

(7) A plurality of circulating fans and a plurality of exhaust fans are disposed in the circulation path and the exhaust path, respectively, so that a high flow rate of the clean air flows through the waiting station. Accordingly, it is possible to certainly avoid stagnation or retention of the clean air inside the waiting station, which in turn prevents contamination by particles or organic substances.

(8) In the waiting station, the buffer ducts are disposed in the front side of the suction inlets of the circulation path so that the nitrogen gas or the clean air may flow through the waiting station at a high flow rate and in the form of a laminar flow. This prevents the clean air from becoming stagnant or retained in the waiting station and thus certainly prevents contamination by particles or organic substances.

(9) The rear-side buffer duct and the front-side buffer duct are disposed at both end portions of one side wall inside the waiting station, which face the clean unit (e.g., facing the aspiration outlet of the aspiration duct), respectively, so that the nitrogen gas or the clean air may flow through the waiting station at a high flow rate and in the form of a laminar flow. This prevents the clean air from becoming stagnant or retained in the waiting station and thus certainly prevents contamination by particles or organic substances.

(10) The pressure adjusting equipment is provided on the housing to automatically adjust pressure in the waiting station, thereby making it possible to maintain the pressure in the waiting station at a constant value in the purge mode, irrespective of fluctuation in pressure inside the clean room.

(11) The pressure adjusting equipment includes the valve orifice configured to connect the collection duct to the aspiration duct, and the valve element configured to be slidably supported by the valve shaft and configured to open/close the valve orifice. Further, the weight of the valve element may be adjusted by changing the number or weight of the weights disposed thereon. With this arrangement, it is possible to adjust the pressure in the waiting station according to a predetermined weight of the valve element in an automatic control manner (or a self-alignment manner).

Now, referring to FIGS. 10 and 11, a heat treatment apparatus according to a second embodiment of the present disclosure will be described.

The heat treatment apparatus according to the second embodiment is different from the first embodiment in that it is configured to detect pressure in the circulation path and monitor abnormality of at least one of the circulation and exhaust fans based on the detection result. Specifically, provided on the circulation path 31 are a rear-side pressure detection pipe 74 (hereinafter referred to as a "rear-side pipe") equipped with a rear-side pressure detecting unit 72, and a front-side pressure detection pipe 75 (hereinafter referred to as a "front pipe") equipped with a front-side pressure detecting unit 73.

Figure 10:
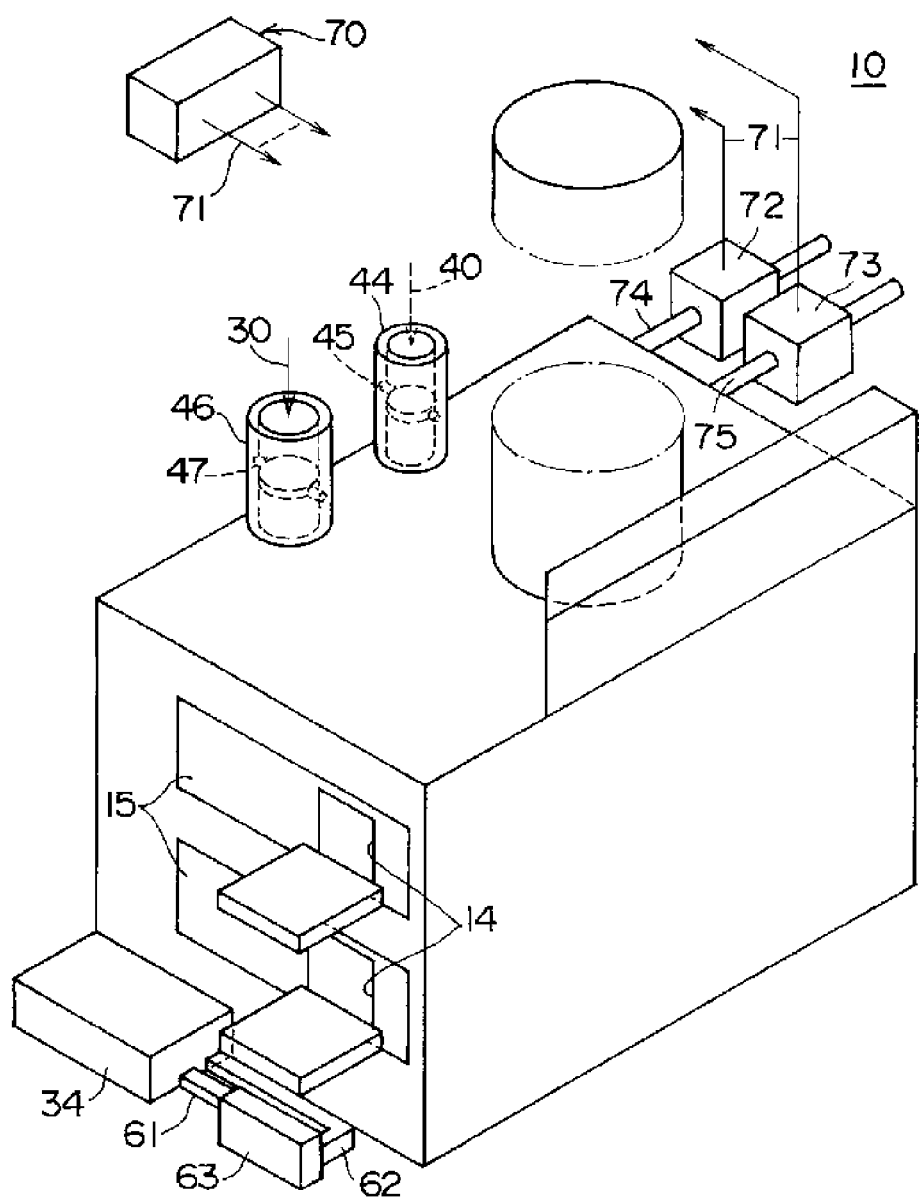
FIG. 10 is a perspective view of a heat treatment apparatus according to a second embodiment of the present disclosure.
Figure 11:
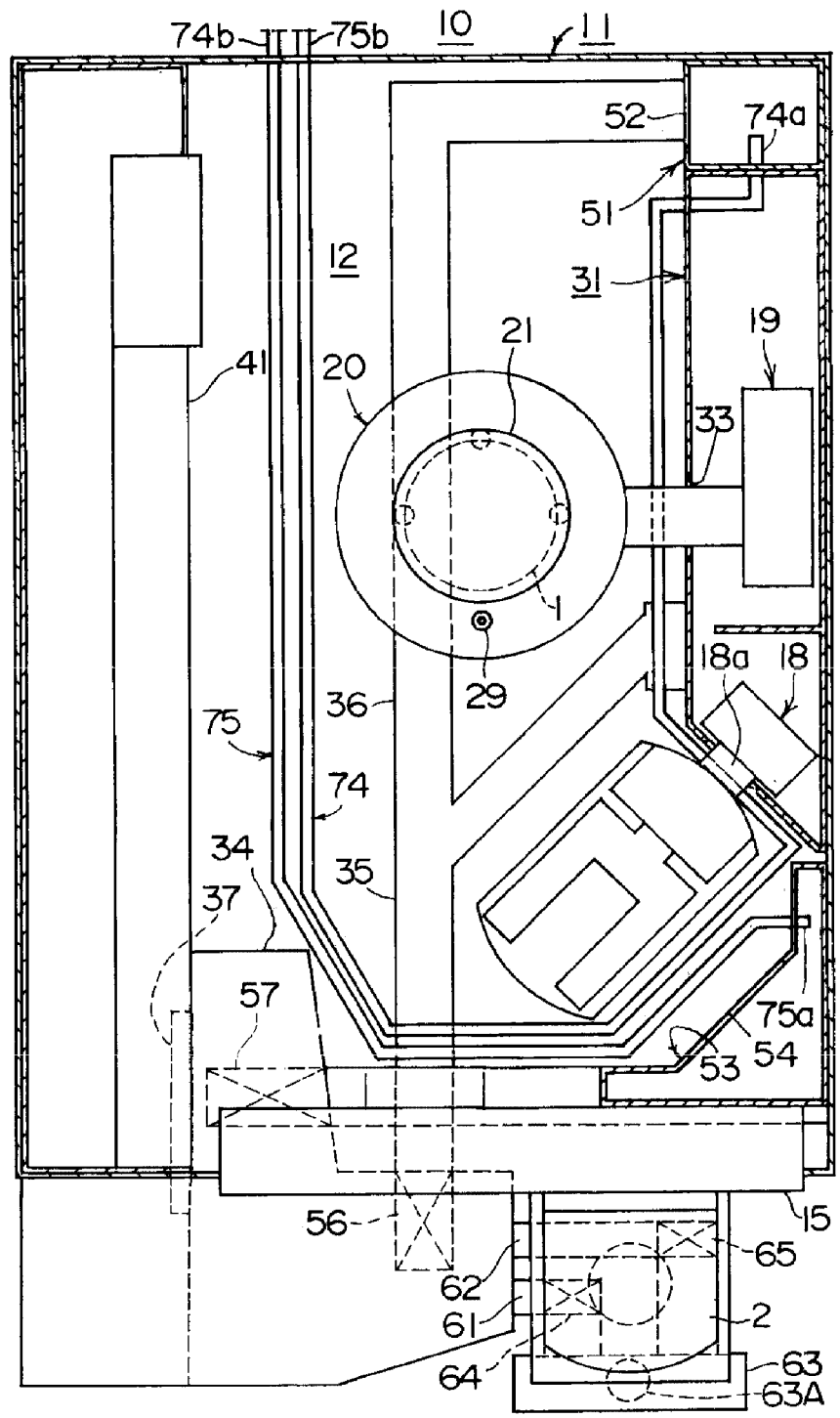
FIG. 11 is a plane sectional view of the heat treatment apparatus shown in FIG. 10.

As shown in FIG. 10, the rear-side pipe 74 is disposed in the floor of the waiting station 12 and is formed in an approximately U-shape at its middle portion. In the rear-side pipe 74, a suction inlet 74*a* is disposed in the vicinity of the suction inlet 52 inside the rear-side buffer duct 51, and an aspiration outlet 74*b* is led out of the rear wall of the housing 11. Similarly, the front-side pipe 75 is disposed in the floor of the waiting station 12 and is formed in an approximately L-shape at its middle portion. In the front-side pipe 75, a suction inlet 75*a* is disposed in the vicinity of the suction inlet 54 inside the front-side buffer duct 53, and an aspiration outlet 75*b* is led out of the rear wall of the housing 11. As shown in FIGS. 10 and 11, the rear-side pressure detecting unit 72 is connected to the aspiration outlet 74*b* of the rear-side pipe 74 which is led out of the housing 11, and the front-side pressure detecting unit 73 is connected to the aspiration outlet 75*b* of the front-side pipe 75 which is led out of the housing 11. Each of the rear-side and front-side pressure detecting units 72 and 73 may be constructed using a differential manometer which measures a difference between the pressure in the duct and the atmosphere pressure (used as a reference pressure). Measurement results obtained at the rear-side and front-side pressure detecting units 72 and 73 are transmitted to the controller 70 through the communication lines 71.

As described above, the suction inlet 74*a* of the rear-side pipe 74 is disposed in the vicinity of the suction inlet 52 of the rear-side buffer duct 51, and the suction inlet 75*a* of the front-side pipe 75 is disposed in the vicinity of the suction inlet 54 of the front-side buffer duct 53. In this arrangement, when the first circulation fan 56, the second circulation fan 57, the first exhaust fan 64 and the second exhaust fan 65 rotate, pressure values measured at the rear-side and front-side pressure detecting units 72 and 73 may be negative with respect to the atmosphere pressure.

The following is a description of the operation of monitoring for an abnormality in the circulation and exhaust fans.

In the second embodiment, the circulation and exhaust fans do not have functions of detecting a rotation stop and a rotation frequency, so that the rotation stop or decrease in the rotation frequency in the circulation and exhaust fans cannot be detected. This makes it difficult to detect any abnormality that may continue in the purge mode and the atmosphere mode, which causes adverse effects on the wafer such as change in the air flow, increase of particles or contamination, fluctuation in pressure inside the waiting station or the like.

To address the above issues, in this embodiment, the rear-side and front-side pressure detecting units 72 and 73 are configured to detect the pressure in the circulation path to monitor any abnormality of the circulation and exhaust fans, thereby preventing such abnormality from continuing in the purge and atmosphere modes.

For example, when the operation of the second circulating fan 57 is suspended (e.g., in an idle state), pressure in the front-side buffer duct 53 becomes approximately equal to that in the waiting station 12. The pressure in the waiting station 12 is maintained at a slightly positive value, so that value measured at the front-side pressure detecting unit 73 has a negative value.

In addition, in the atmosphere mode, when either of the first and second exhaust fans 64 and 65 is in an idle state, the pressure in the waiting station 12 is maintained at an excessively positive value, so that the rear-side and front-side buffer ducts 51 and 53 are maintained at a positive pressure. Accordingly, measurement values by the rear-side and front-side pressure detecting units 72 and 73 become a negative value.

As described above, when the measurement value by the rear-side and front-side pressure detecting units 72 and 73 decreases (or become a negative value), the controller 70 determines that at least one of the first circulation fan 56, the second circulation fan 57, the first exhaust fan 64 and the second exhaust fan 65 is in the idle state (or stops the rotation) or the rotation frequency of the respective fan(s) is decreased. Thus, it is possible to prevent any abnormality from occurring or continuing in the purge and atmosphere modes.

For example, it may be determined that an abnormality occurs in the purge mode if the measurement value by the rear-side pressure detecting unit 72 or the front-side pressure detecting unit 73 is equal to or less than 1 Pa (Pascal). Further, it may be determined that an abnormality occurs in the atmosphere mode if the measurement value by the rear-side pressure detecting unit 72 or the front-side pressure detecting unit 73 is equal to or less than 30 Pa (Pascal). Under these assumptions, if an abnormality is determined to occur, the controller 70 may generate an interlock signal to stop the rotation of the first circulation fan 56, the second circulation fan 57, the first exhaust fan 64 and the second exhaust fan 65.

An exhaust (or aspiration) side of the first exhaust fan 64 and an exhaust (or aspiration) side of the second exhaust fan 65 communicate with each other via the third exhaust duct 63 so that they define a single enclosed space. Thus, if pressure detecting units are disposed at the respective exhaust sides of the first and second exhaust fans 64 and 65, the first and second exhaust fans 64 and 65 are affected by each other, which may result in the failure to accurately measure the pressure by the pressure detecting units.

An intake (or suction) side of the first exhaust fan 64 and an exhaust (or aspiration) side of the second exhaust fan 65 communicate with each other via the collection duct 34 so that they define a single enclosed space. Thus, if pressure detecting units are disposed at the intake side of the first exhaust fan 64, the exhaust side of the second exhaust fan 65 or the collection duct 34, the first and second circulation fans 56 and 57 and the first and second exhaust fans 64 and 65 are affected by each other, which may result in the failure to accurately measure the pressure by the pressure detecting units.

In this embodiment, the suction inlet 74a of the rear-side pipe 74 is disposed within the rear-side buffer duct 51 and the suction inlet 75a of the front-side pipe 75 is disposed within the front-side buffer duct 53. With this arrangement, the first and second circulation fans 56 and 57 and the first and second exhaust fans 64 and 65 are not affected by each other, which allows the rear-side pressure detecting unit 72 and the front-side pressure detecting unit 73 to accurately measure the pressure.

Further, the suction inlet 74a of the rear-side pipe 74 is disposed in the vicinity of the suction inlet 52 of the rear-side buffer duct 51, and the suction inlet 75a of the front-side pipe 75 is disposed in the vicinity of the suction inlet 54 of the front-side buffer duct 53, which facilitates the operation of piping the rear-side pipe 74 and the front-side pipe 75.

The second embodiment as described above may have one or more of the following effects:

(1) The rear-side pipe equipped with the rear-side pressure detecting unit, and the front pipe equipped with the front-side pressure detecting unit are provided on the circulation path so that the pressure detecting units detect the pressure in the circulation path to monitor any abnormality of the circulation and exhaust fans. Therefore, it is possible to prevent any abnormality from occurring or continuing in the purge and atmosphere modes.

(2) According to the features and effects as described in item (1) above, it is possible to avoid any adverse effects on the wafers such as change in the air flow, increase in particles or contamination, fluctuation in pressure inside the waiting station or the like.

(3) The pressure detecting units detect the pressure in the circulation path to monitor any abnormality of the circulation and exhaust fans, which allows, for example, an AC (alternative current) fan to be employed without implementing therein any functions of detecting a rotation stop and a rotation number. Thus, it is possible to generate a sufficient amount of air flow in a relatively small space at low cost.

(4) The suction inlet of the rear-side pipe is disposed within the rear-side buffer duct, and the suction inlet of the front-side pipe is disposed within the front-side buffer duct. With this arrangement, the first and second circulation fans and the first and second exhaust fans are not affected by each other, which makes it possible to improve a pressure measurement accuracy of the rear-side pressure detecting unit and the front-side pressure detecting unit.

(5) The suction inlet of the rear-side pipe is disposed in the vicinity of the suction inlet of the rear-side buffer duct, and the suction inlet of the front-side pipe is disposed in the vicinity of the suction inlet of the front-side buffer duct, which makes it possible to facilitate the operation of piping the rear-side pipe and the front-side pipe.

Figure 12:
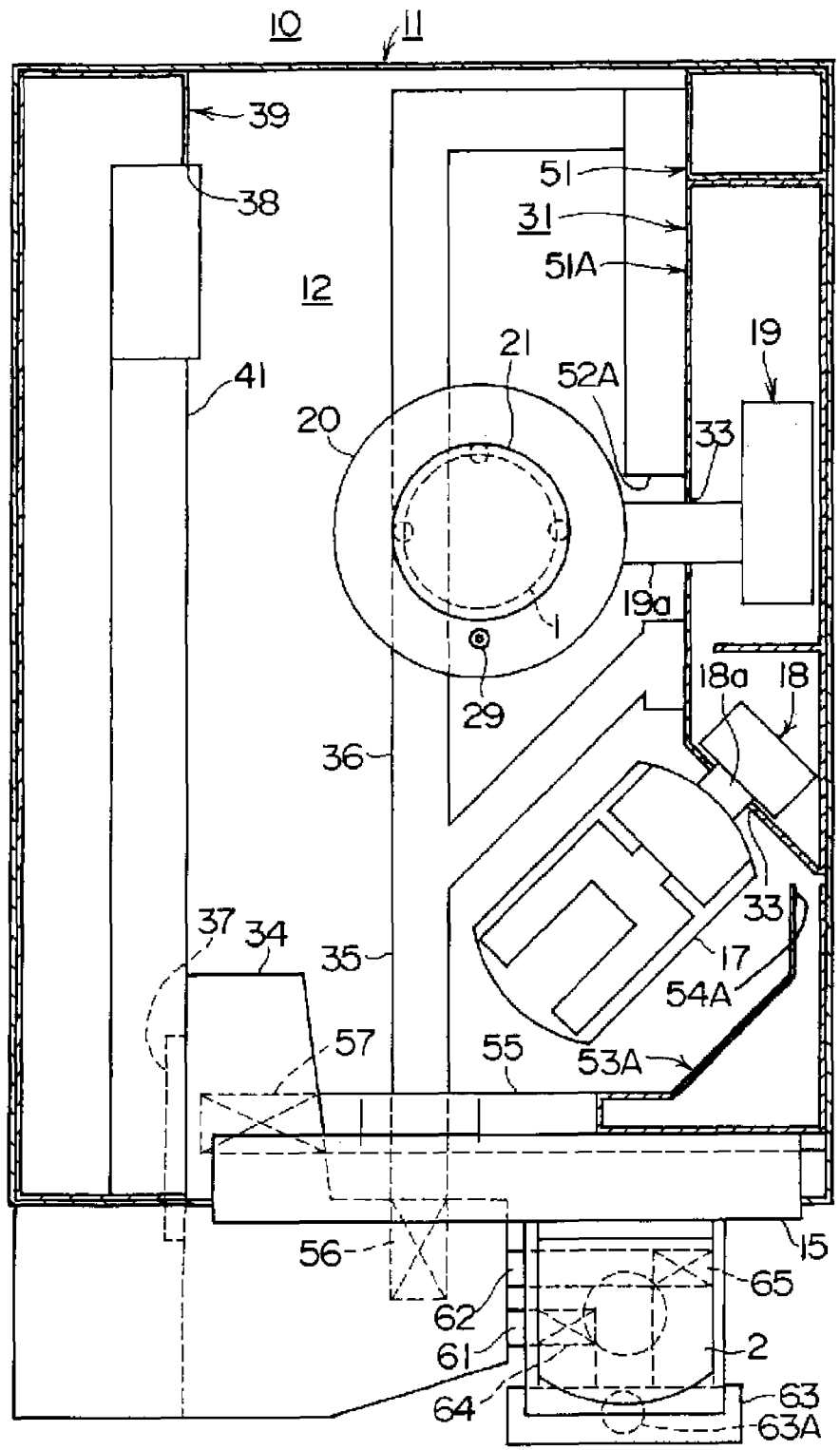
FIG. 12 is a plane sectional view of a heat treatment apparatus according to a third embodiment of the present disclosure.
Figure 13:
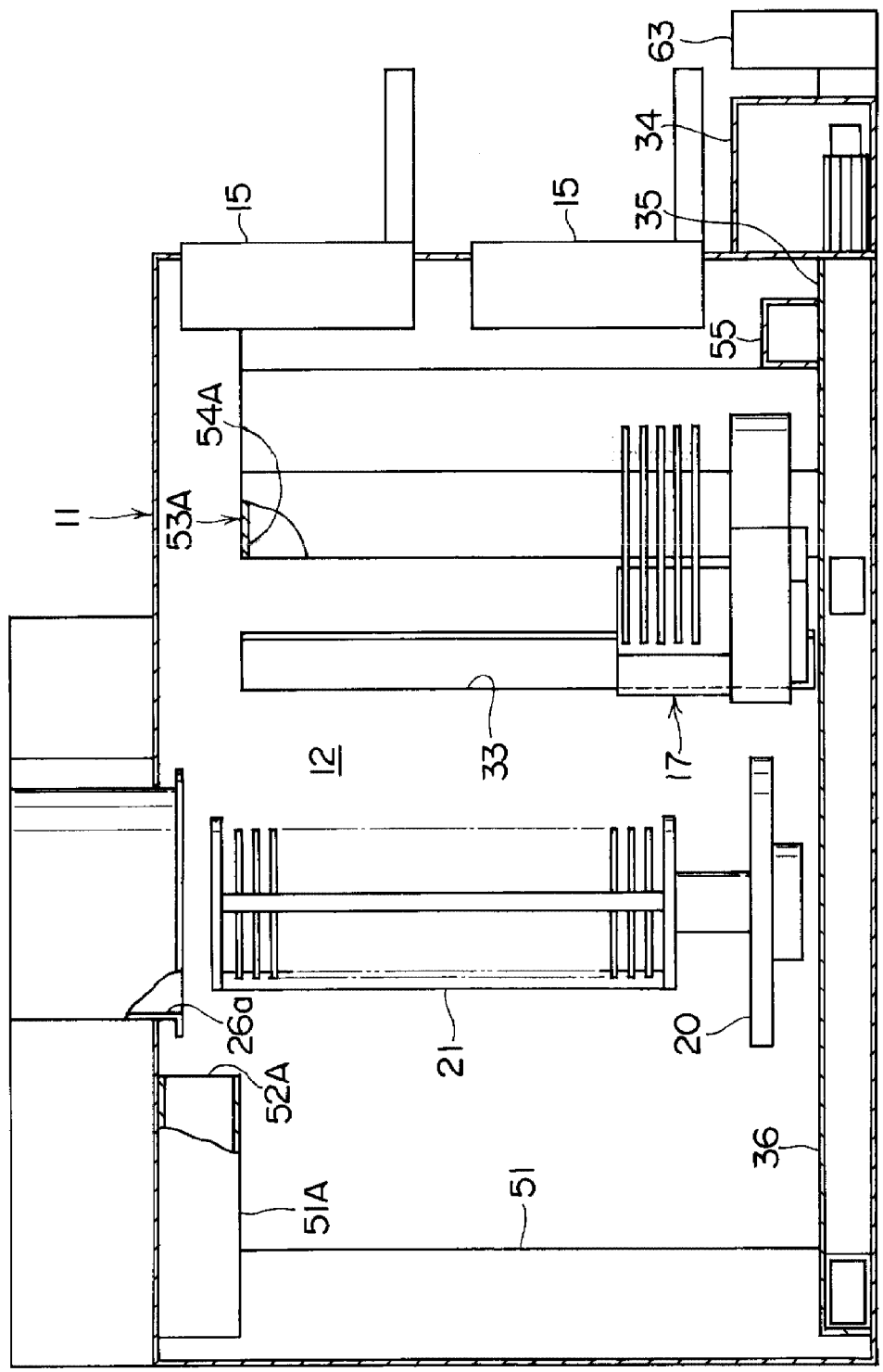
FIG. 13 is a side sectional view of the heat treatment apparatus shown in FIG. 12.

Now, referring to FIGS. 12 and 13, a description of a heat treatment apparatus according to a third embodiment of the present disclosure will be provided.

In the third embodiment, a front-side buffer duct 53A is disposed along the transfer elevator 18 in the vicinity of the wafer transfer equipment 17, and a suction inlet 54A is formed along a movement path of the arm 18a of the transfer elevator 18. In this case, the number of vertical movements of the wafer transfer equipment 17 increases as the number of wafers to be processed increases, which requires the transfer elevator 18 to be driven at a higher speed. Further, this increases a generation amount of particles in the transfer elevator 18.

In this embodiment, the suction inlet 54A of the front-side buffer duct 53A is disposed in the vicinity of the transfer elevator 18, so that any generated particles are quickly sucked and discharged therethrough. Therefore, it is possible to inhibit or mitigate the particles from being dispersed to the surroundings. In other words, it is possible to avoid dispersing particles to the surroundings without increasing the amount of air flow in the front-side buffer duct 53A.

Further, in the this embodiment, a furnace opening duct 51A is connected to the top portion of the rear-side buffer duct 51, and a suction inlet 52A of the furnace opening duct 51A is disposed to face a lower end opening (or furnace opening) 26a of the manifold 26. When the boat 21 is carried into the waiting station 12 after a film formation process, heat generated at the furnace opening 26a or heat generated at the boat 21 may be discharged to the waiting station 12. Further, such heat may be discharged upward as well. In the this embodiment, the suction inlet 52A of the furnace opening duct 51A is disposed to face the furnace opening 26a so that it can quickly suck and discharge any generated heat, which increases a wafer cooling rate.

Figure 14A:
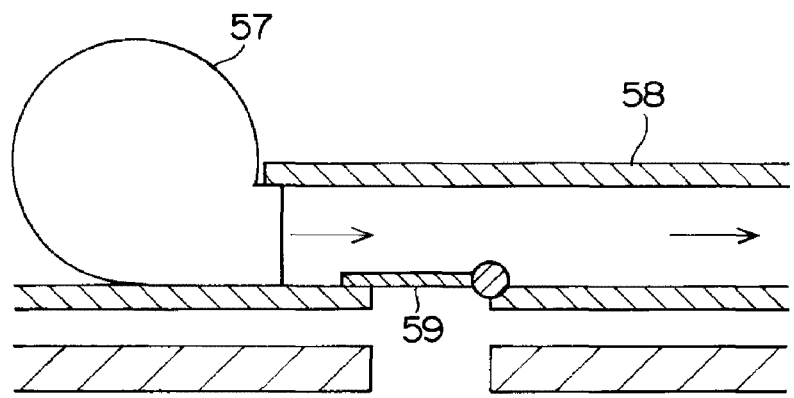
FIGS. 14A and 14B are sectional views showing primary portions of a heat treatment apparatus according to a fourth embodiment of the present disclosure, being operated in a purge mode and an atmosphere mode, respectively.
Figure 14B:
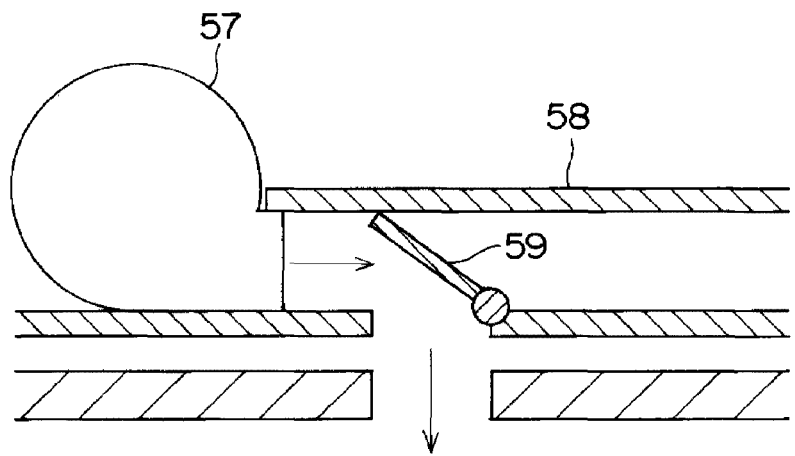

FIGS. 14A and 14B illustrate the operation of a heat treatment apparatus according to a forth embodiment of the present disclosure.

In the fourth embodiment, a fan exhaust duct 58 is connected to an exhaust side (i.e., a downstream side of an aspiration outlet) of the second circulation fan 57, and a damper 59 configured to switch air flow disposed in the middle portion of the fan exhaust duct 58. In the purge mode in which the nitrogen gas circulates throughout the waiting station 12, as shown in FIG. 14A, the damper 59 switches its configuration to allow the air flow inside the fan exhaust duct 58. Meanwhile, in the atmosphere mode in which the clean air is blown off from the clean unit 41 to the waiting station 12 and then is exhausted outside through the exhaust outlet of the waiting station 12, as shown in FIG. 14B, the damper 59 switches its configuration to prevent the air flow inside the fan exhaust duct 58. With this arrangement, the damper 59 is configured to switch between the purge and atmosphere modes. According to this embodiment, the first circulation fan 56, the second circulation fan 57, the exhaust valve 63A and the damper 59 may make up a switching system.

Figure 15A:
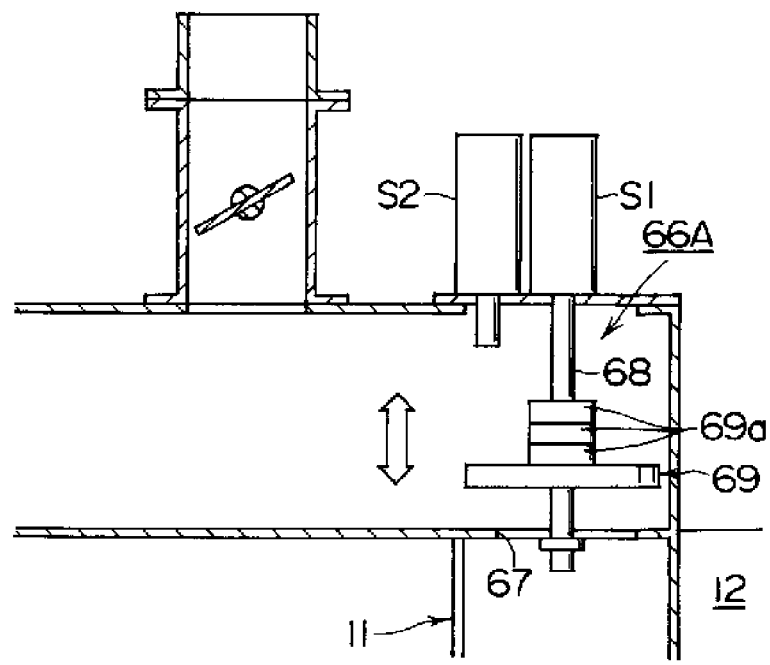
FIG. 15A to 15C are sectional views showing primary portions of a heat treatment apparatus according to a fifth embodiment of the present disclosure, which is performing a normal operation, an operation of filling nitrogen gas, and an operation in an atmosphere mode.
Figure 15B:
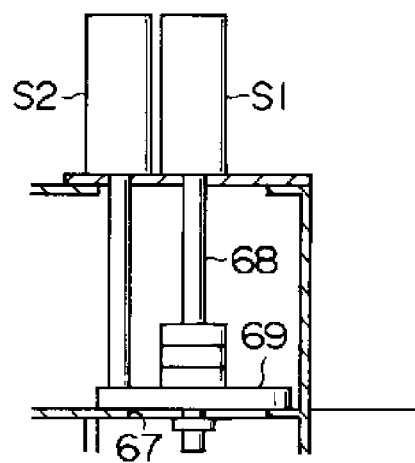
Figure 15C:
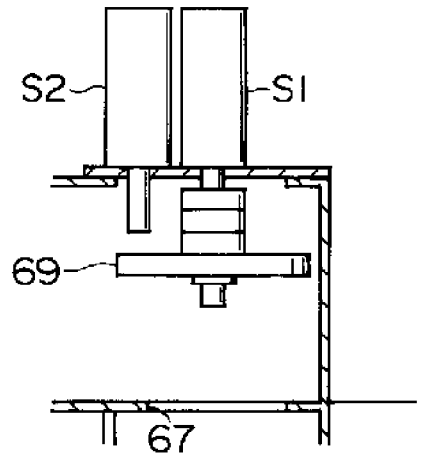

FIGS. 15A to 15C illustrate the operation of a heat treatment apparatus according to a fifth embodiment of the present disclosure.

In the fifth embodiment, a pressure adjusting equipment 66A configured to automatically adjust pressure in the waiting station 12 includes the valve orifice 67 configured to connect the waiting station 12 to the clean room, the valve element 69 configured to be slidably supported by the valve shaft 68 and configured to open/close the valve orifice 67, the weights 69a configured to adjust weight of the valve element 69, a first cylinder device S1 configured to expand and contract the valve shaft 68, and a second cylinder device S2 configured to regulate a position of the valve element 69.

In a normal operation, the first cylinder device S1 is in an expanded state and the second cylinder device S2 is in a contracted state. In this case, the valve element 69 operates in response to a level of pressure in the waiting station 12 so that the pressure in the waiting station 12 can be automatically maintained at a predetermined value.

When atmosphere in the waiting station 12 (i.e., in an atmosphere state) is replaced with nitrogen gas (i.e., changed to a state where the waiting station 12 is filled with nitrogen gas), as shown in FIG. 15B, the second cylinder device S2 is expanded so that the valve element 69 may not be movable. As a result, the pressure in the waiting station 12 increases, so that the inside of the waiting station 12 forms a more tightly sealed space. This prevents the nitrogen gas from leaking outside of the waiting station 12, thus allowing a higher rate of gas displacement therein. Further, when the atmosphere in the waiting station 12 is switched from the nitrogen gas-filled state to the atmosphere state, as shown in FIG. 15C, the first cylinder device S1 contracts. As a result, the valve orifice 67 is completely opened, thereby permitting a maximum flow rate of gas therethrough, which in turn allows a higher rate of gas displacement in the waiting station 12.

In the process of adjusting the pressure in the waiting station 12, if a large number of the weights 69a are loaded on the valve element 69, the valve element 69 may slightly lift off during a gas exhaust process, which makes a narrow opening in the valve orifice 67. This allows a slower rate of gas displacement in the waiting station 12.

While certain embodiments have been described, these embodiments have been presented by way of example only, and are not intended to limit the scope of the inventions. Indeed, the embodiments described herein may be embodied in a variety of other forms.

Figure 9:
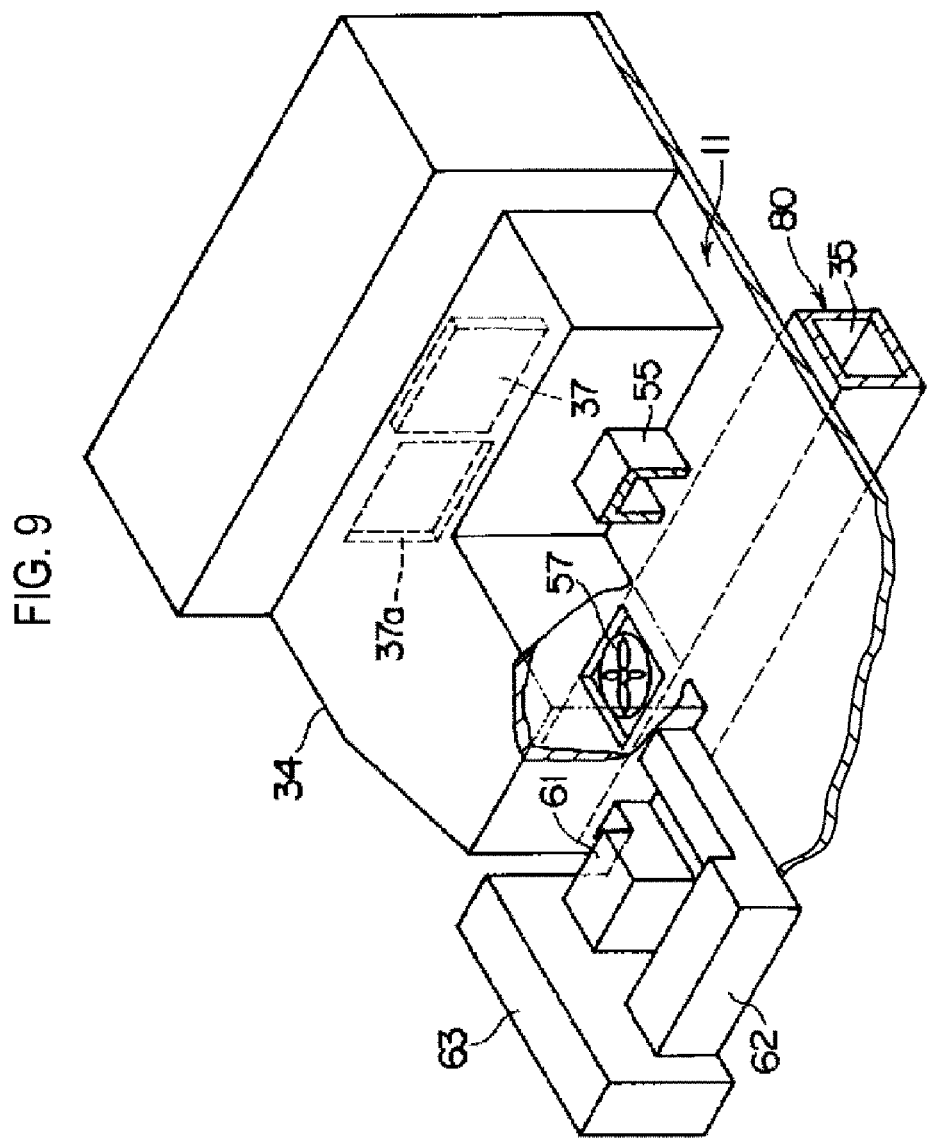
FIG. 9 is a partially broken perspective view of a circulation duct.

For example, while in the embodiments explained above, the communication ducts are disposed on the floor of the waiting station, in other embodiments they may be constructed by using a reinforced pipe 80 welded to the housing 11 as shown in FIG. 9. The use of the reinforced pipe 80 is not limited to the first and the second communication ducts 35 and 36 and is also applicable to the first to third exhaust ducts 61 to 63. The use of the reinforced pipe in the communication ducts and the exhaust ducts allows the circulation path and the exhaust path to be configured in a simpler manner and also makes it possible to effectively utilize the restricted space in the waiting station. Further, this makes it possible to increase the cross-sectional area of the circulation path and the exhaust path.

In some embodiments, the circulation fans and the exhaust fans may be omitted.

Further, although in the above embodiments, the exhaust path is connected to the lower grating space of the clean room, it may not be limited thereto but may be also connected to, for example, a utility box.

Further, while in the above embodiments, the filter mounted in the clean unit has been explained to be one type of filter for cleaning the gas by filtering out particles, the present disclosure is not limited thereto. In an alternate embodiment, the filter may be implemented using two separate types of filters, i.e., one type of filter for filtering particles and the other type of filter for filtering organic substances.

While in the above embodiments, the nitrogen gas has been explained to be used as the inert gas, the present disclosure is not limited thereto.

Further, while the above embodiments provide a batch-type vertical heat treatment apparatus, the present disclosure is not limited thereto but is also applicable to any types of substrate processing apparatuses including a batch-type vertical diffusion apparatus.

According to some of the above embodiments of the present disclosure, it is possible to generate an air flow inside a waiting station in a uniform manner, thereby preventing contamination by particles or organic substances.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a process chamber configured to process a substrate;
a holder configured to hold the substrate and carry the substrate into the process chamber;
a waiting station located outside the process chamber in which the holder waits prior to carrying the substrate into the process chamber;
a circulation path having at least one suction duct formed at one side of the waiting station to suck an atmosphere of the waiting station therethrough and communication ducts directly connected to the at least one suction duct at a downstream side of the at least one suction duct, and configured to recirculate a gas throughout the waiting station;
a collection duct connected to the communication ducts;
a circulation fan installed at an outlet of each of the communication ducts and configured to establish air flow from the communication ducts to the collection duct; and
an exhaust duct connected to the collection duct at a downstream side of the circulation fan,
wherein the collection duct has multiple inlets and outlets, and wherein one of the communication ducts is connected to one of the inlets and at least one of the outlets is connected to the exhaust duct, to switch a flow of the gas collected through the communication ducts into either one of the circulation path or the exhaust duct.

2. The apparatus of claim 1, wherein at least one exhaust fan configured to exhaust the gas from the circulation path is provided in the exhaust duct.

3. The apparatus of claim 1, wherein at least one buffer duct configured to suck the gas inside the waiting station therethrough is provided in a front side of at least one suction inlet formed in the circulation path.

4. The apparatus of claim 1, wherein a rear-side buffer duct and a front-side buffer duct, each being configured to exhaust the gas from the waiting station therethrough, are respectively provided at both end portions of one side wall inside the waiting station, which face aspiration outlets formed on the circulation path.

5. The apparatus of claim 1, wherein at least one exhaust fan configured to adjust pressure inside the waiting station in an atmosphere mode, is provided in the exhaust duct.

6. A method for processing a substrate using a substrate processing apparatus including a process chamber configured to process a substrate, a holder configured to hold the substrate and carry the substrate into the process chamber, a waiting station located outside the process chamber in which the holder waits prior to carrying the substrate into the process chamber, at least one suction duct formed at one side of the waiting station to suck an atmosphere of the waiting station therethrough, a circulation path having communication ducts directly connected to the at least one suction duct at a downstream side of the at least one suction duct and configured to recirculate a gas throughout the waiting station, a collection duct connected to the communication ducts, a circulation fan installed at an outlet of each of the communication ducts and configured to establish air flow from the communication ducts to the collection duct, and an exhaust duct connected to the collection duct at a downstream side of the circulation fan, wherein the collection duct has multiple inlets and outlets, and wherein one of the communication ducts is connected to one of the inlets and at least one of the outlets is connected to the exhaust duct, to switch a flow of the gas collected through the communication ducts into either one of the circulation path or the exhaust duct, the method comprising:
holding the substrate in the holder at the waiting station located outside the process chamber;
circulating the gas through the circulation path in the waiting station; and
exhausting the gas through the exhaust duct from the waiting station.

7. The apparatus of claim 1, further comprising a pressure adjusting equipment configured to adjust pressure in the waiting station, wherein the pressure adjusting equipment includes a valve orifice configured to connect the waiting station to an outside of the substrate processing apparatus, a valve element configured to open/close the valve orifice, and a valve shaft configured to slidably support the valve element.

8. The apparatus of claim 7, wherein the pressure adjusting equipment further includes a first cylinder device configured to expand and contract the valve shaft, and a second cylinder device configured to regulate a position of the valve element.

9. The apparatus of claim 1, further comprising an aspiration duct formed at the other side of the waiting station to blow off the gas into the waiting station therethrough, wherein a lower end portion of the aspiration duct is connected to the collection duct.

10. The apparatus of claim 9, wherein the aspiration duct includes an aspiration outlet formed over an entire surface of the aspiration duct to face the at least one suction duct.

11. The apparatus of claim 1, wherein the collection duct includes a cutoff valve disposed in a portion at which the collection duct is connected to the circulation path at a different location from the communication ducts.

12. The apparatus of claim 11, further comprising a controller configured to control at least the cutoff valve and the circulation fan,
wherein the controller is configured to control the cutoff valve to determine whether the gas collected in the collection duct flows into the circulation path at a different location from the communication ducts or the exhaust duct.

13. The method of claim 6, wherein the substrate processing apparatus further includes an aspiration duct formed at the other side of the waiting station to blow off the gas into the waiting station therethrough, and
wherein a lower end portion of the aspiration duct is connected to the collection duct.

14. The method of claim 13, wherein the aspiration duct includes an aspiration outlet formed over an entire surface of the aspiration duct to face the at least one suction duct.

15. The method of claim 6, wherein the collection duct includes a cutoff valve disposed in a portion at which the collection duct is connected to the circulation path at a different location from the communication ducts.

16. The method of claim 15, further comprising a controller configured to control at least the cutoff valve and the circulation fan,
wherein the controller is configured to control the cutoff valve to determine whether the gas collected in the collection duct flows into the circulation path at a different location from the communication ducts or the exhaust duct.

17. A substrate processing apparatus, comprising:
a process chamber configured to process a substrate;
a holder configured to hold the substrate and carry the substrate into the process chamber;
a waiting station located outside the process chamber in which the holder waits prior to carrying the substrate into the process chamber;
a circulation path having at least one suction duct mounted at one side of the waiting station to suck a gas inside the waiting station therethrough and at least one communication duct of which a first end is directly connected to the at least one suction duct, and configured to recirculate the gas throughout the waiting station therethrough;
a collection duct connected to the at least one communication duct and configured to collect the gas sucked at the at least one suction duct through the at least one communication duct;
a circulation fan installed at an outlet of the at least one communication duct and configured to establish air flow from the at least one communication duct to the collection duct; and
an exhaust duct connected to the collection duct at a downstream side of the circulation fan and configured to exhaust the gas from the collection duct therethrough,
wherein the collection duct is configured to switch a flow of the gas collected through the at least one communication duct into either one of the circulation path or the exhaust duct.

* * * * *